(12) United States Patent
Shiraishi et al.

(10) Patent No.: US 10,549,984 B2
(45) Date of Patent: Feb. 4, 2020

(54) MEMS PACKAGE AND METHOD OF MANUFACTURING THE SAME

(71) Applicant: SAE Magnetics (H.K.) Ltd., Hong Kong (HK)

(72) Inventors: Masashi Shiraishi, Hong Kong (HK); Toyotaka Kobayashi, Hong Kong (HK); Hironobu Hayashi, Hong Kong (HK)

(73) Assignee: SAE Magnetics (H.K.) Ltd., Hong Kong (HK)

( * ) Notice: Subject to any disclaimer, the term of this patent is extended or adjusted under 35 U.S.C. 154(b) by 36 days.

(21) Appl. No.: 16/022,717

(22) Filed: Jun. 29, 2018

(65) Prior Publication Data

US 2020/0002160 A1     Jan. 2, 2020

(51) Int. Cl.
*B81B 7/00*     (2006.01)
*B81C 1/00*     (2006.01)
*H04R 19/04*    (2006.01)

(52) U.S. Cl.
CPC ........ *B81B 7/0048* (2013.01); *B81C 1/00325* (2013.01); *H04R 19/04* (2013.01); *B81B 2201/0257* (2013.01); *B81B 2207/012* (2013.01); *B81B 2207/07* (2013.01); *B81C 2203/035* (2013.01); *H04R 2201/003* (2013.01)

(58) Field of Classification Search
None
See application file for complete search history.

(56) References Cited

U.S. PATENT DOCUMENTS

| 2015/0259194 A1* | 9/2015 | Lin | B81B 7/007 |
| | | | 257/773 |
| 2016/0214857 A1* | 7/2016 | Lin | B81B 7/007 |
| 2016/0297676 A1* | 10/2016 | Pahl | B81C 1/00825 |

FOREIGN PATENT DOCUMENTS

| JP | 2007184341 A | 7/2007 |
| JP | 201239272 A | 2/2012 |
| JP | 2012114672 A | 6/2012 |
| JP | 2016523725 A | 8/2016 |

* cited by examiner

*Primary Examiner* — Lex H Malsawma

(57) ABSTRACT

A MEMS package has a MEMS chip, and a package substrate which the MEMS chip is adhered. The MEMS chip has an element substrate which a movable element is formed. The MEMS package has a plurality of bonding bumps adhered to both of an opposing surface, of the element substrate and the package substrate. The MEMS package has unevenly arranged structure which all the plurality of bonding bumps are unevenly arranged in a part of the opposing surface.

13 Claims, 12 Drawing Sheets

MEMS PACKAGE AND METHOD OF MANUFACTURING THE SAME

BACKGROUND

Field of the Invention

The present invention relates to a MEMS package which a MEMS chip, being used as a microphone, a sensor and so on, is mounted on a package substrate and method of manufacturing the same.

Related Background Art

A minute device, which is called MEMS (Micro Electro Mechanical Systems), is conventionally known. The MEMS is a device which a minute movable element and an electronic circuit are integrated on a substrate (which is also called element substrate) made of silicon and so on. Because the whole of MEMS is formed in a chip-like form, the MEMS is also called a MEMS chip, in the present invention. The MEMS chip is used as a microphone, sensor, actuator and so on.

For example, the MEMS chip, which is used as the microphone, has a membrane being a thin-film and electrodes made of one or two thin-film arranged in the neighborhood of the membrane, and the MEMS chip has a structure which a concave part, for arranging the membrane, is formed. In case of the MEMS chip, which is used as the microphone of capacitance-type, displacement of the membrane, in accordance with sound pressure, is detected as displacement of capacitance between the electrodes. Therefore, the MEMS chip, which is used as the microphone of capacitance-type, operates with the principle of a variable capacitor.

Then, concerning the MEMS package which the MEMS chip is mounted on the package substrate, the following two structures are conventionally known. The one is a structure which the MEMS chip is mounted on the package substrate by FCB (Flip Chip Bonding, for example see JP2016-523725 (also called patent document 1), JP2007-184341 (also called patent document 2)), and the other one is a structure which the MEMS chip is mounted on the package substrate by a Wire Bonding (for example see JP2012-114672 (also called patent document 3), JP2012-39272 (also called patent document 4)).

SUMMARY OF THE INVENTION

In case of the structure which the MEMS chip is mounted on the package substrate by FCB, solder bumps are formed on the surface of the MEMS chip. After that, reflow is performed on the state which the solder bumps are arranged on electrodes pads of the package substrate (reflow step). The solder bumps are adhered to the MEMS chip and the package substrate by the reflow step.

However, because there is difference in materials of the MEMS chip and the package substrate, both thermal expansion coefficient is different. Therefore, change of volume is different between the MEMS chip and the package substrate, after the MEMS chip is mounted on the package substrate and temperature of them decreases. Thereby residual stress is applied to the MEMS chip, after it is mounted on the package substrate, the MEMS chip warps. Then, stress is applied to the membrane of the MEMS chip. When stress is applied to the membrane, vibration and amplitude of the membrane, which sound pressure is applied, becomes inappropriate.

To solve the above-mentioned problems, there is conventionally an idea which thickness of the membrane is enlarged so that the membrane stands up to stress, thereby influence of stress decreases.

However, when thickness of the membrane is enlarged, vibration and amplitude of the membrane, which sound pressure is applied, becomes small. Therefore, sensitivity of the MEMS chip decreases. Further, even if thickness of the membrane is enlarged, thereby influence of stress in the membrane becomes merely small, and stress applied to the membrane does not decrease.

As described above, in the structure which the MEMS chip is mounted on the package substrate by FCB, it is conventionally required that stress itself, caused by difference of thermal expansion coefficients of the MEMS chip and the package substrate, decreases.

Hence the present invention is made to solve the above problem, and it is an object that stress being applied to the membrane decreases, in the MEMS package and Method of Manufacturing the Same.

To solve the above problem, the present invention is a MEMS package including: a MEMS chip, and a package substrate which the MEMS chip is adhered; the MEMS chip includes an element substrate which a movable element is formed, the MEMS package includes a plurality of bonding bumps adhered to both an opposing surface, of the element substrate, which opposes the package substrate and the package substrate, the MEMS package includes an unevenly arranged structure which all the plurality of bonding bumps are unevenly arranged in a part of the opposing surface.

In case of the above-described MEMS package, it is possible that the opposing surface includes a boding area, which all the plurality of bonding bumps are arranged, and a non-bonding area, which the bonding bumps are not arranged, the size of the non-bonding area is larger than the size of the boding area.

Further, in case of the above-described MEMS package, it is preferable that the opposing surface includes a boding area, which all the plurality of bonding bumps are arranged, and a non-bonding area, which the bonding bumps are not arranged, the size of the non-bonding area is larger than the size of the boding area, the MEMS package further includes a dummy bump which is arranged in the non-bonding area, and which is adhered to the opposing surface and is not adhered to the package substrate.

Further, in case of the above-described MEMS package, it is preferable that the element substrate is formed by a rectangular-shaped in a plan view, the bonding area is assigned to an area including only one of the four corner parts of the opposing surface.

Furthermore, in case of the above-described MEMS package, it is preferable that the element substrate is formed with a rectangular-shaped in a plan view, all the plurality of bonding bumps are arranged along with one side of the opposing surface.

Further, it is preferable that the opposing surface includes a boding area, which all the plurality of bonding bumps are arranged, and a non-bonding area, which the bonding bumps are not arranged, the boding area is assigned to a divided area of the case when the opposing surface is divided into two divided areas having equal size.

Further, it is preferable that the opposing surface includes a boding area, which all the plurality of bonding bumps are arranged, and a non-bonding area, which the bonding bumps are not arranged, the boding area is assigned to a divided area of the case when the opposing surface is divided into four divided areas having equal size.

Further, it is possible that the MEMS package further includes a dummy bump which is adhered to the opposing surface and is not adhered to the package substrate, the dummy bump is arranged in a non-bonding divided area which is not assigned to the bonding area of the four divided areas.

Further, it is also possible that the dummy bump has a non-adhesive contacting structure which the dummy bump is in contact with the package substrate without adhesive to the package substrate.

Further, the present invention provides a method of manufacturing a MEMS package, using a MEMS chip and a package substrate which the MEMS chip is adhered including: a bump forming step of forming a plurality of solder bumps on an opposing surface, of the MEMS chip, opposing to the package substrate; and a MEMS chip mounting step of mounting a MEMS chip with bump, which the plurality of solder bumps are formed by the bump forming step, on the package substrate; the bump forming step is performed so that at least two solder bumps of the plurality of solder bumps become unevenly arranged bumps which are unevenly arranged in a part of the opposing surface, MEMS chip mounting step is performed so that the unevenly arranged bumps are arranged in electrode pads formed in a package surface, of the package substrate, opposing to the MEMS chip, and at least solder bump except for the unevenly arranged bumps is arranged in an insulated pad, formed in a package surface, which the surface is insulated.

In case of the above-described method of manufacturing a MEMS package, it is preferable that the method of manufacturing a MEMS package further includes a MEMS chip connecting step of making the solder bump arranged in the insulated pad a dummy bump which is adhered to the opposing surface and is not adhered to the package substrate.

Further, it is preferable that the bump forming step is performed so that the unevenly arranged bumps are arranged in one of four divided areas, having the equal size, which the opposing surface is divided.

Furthermore, it is possible that a rectangular MEMS chip, having an element substrate formed in a rectangular-shaped in a plan view, is used as the MEMS chip, the bump forming step is performed so that the unevenly arranged bumps are respectively arranged in the neighborhood of one of four corner parts of the element substrate.

Further, it is also possible that a rectangular MEMS chip, having an element substrate formed in a rectangular-shaped in a plan view, is used as the MEMS chip, the bump forming step is performed so that the unevenly arranged bumps are arranged along with one side of the element substrate.

The present invention will be more fully understood from the detailed description given hereinbelow and the accompanying drawings which are given by way of illustration only, and thus are not to be considered as limiting the present invention.

DETAILED DESCRIPTION OF THE EMBODIMENTS

In the following, embodiments of the present invention will be described with reference to the drawings. Note that the same components will be referred to with the same numerals or letters, while omitting their overlapping descriptions.

(Structure of the MEMS Package)

Figure 1:
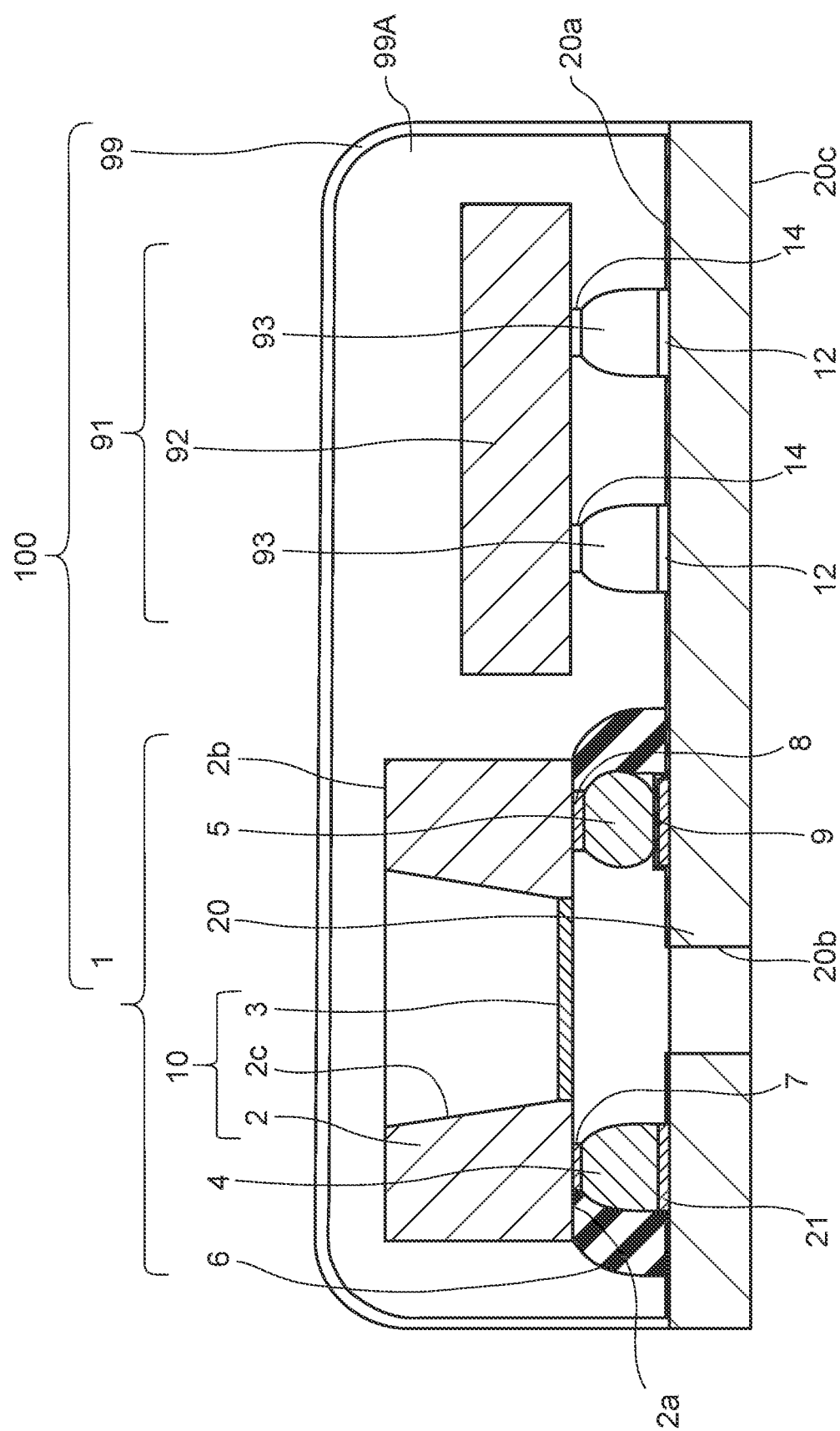
FIG. 1 is a sectional view of a part corresponding to the line 1-1 in FIG. 4 showing a MEMS microphone having the MEMS package according to the embodiment of the present invention.
Figure 2:
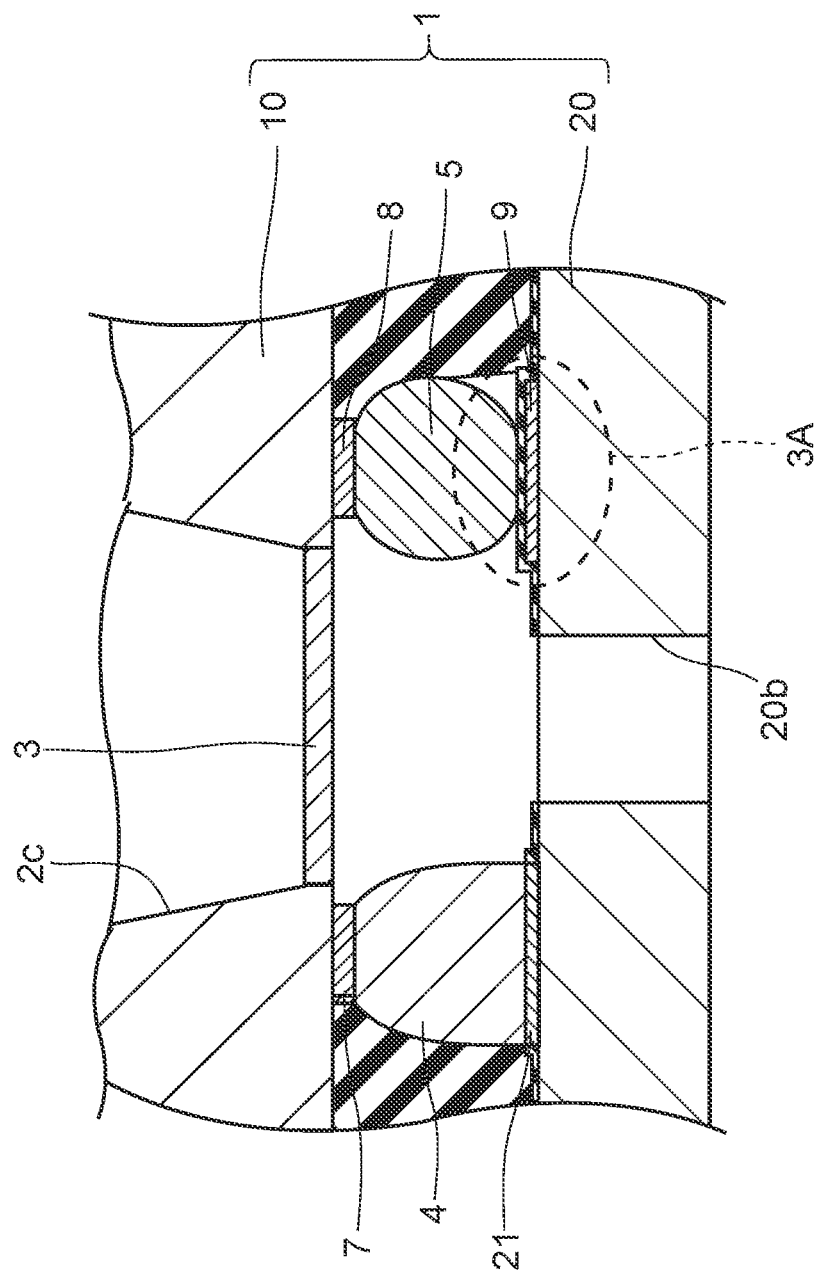
FIG. 2 is a sectional view showing a principal part of FIG. 1 with enlargement.
Figure 3:
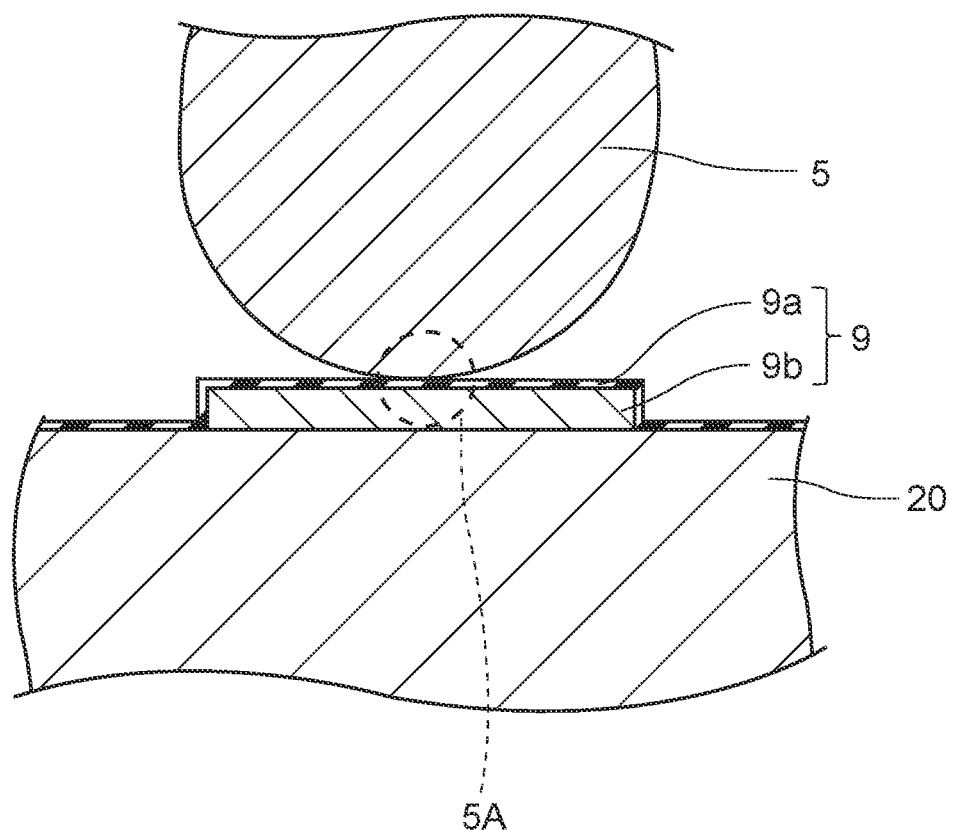
FIG. 3 is a sectional view showing a part indicated by 3A in FIG. 2 with enlargement.
Figure 4:
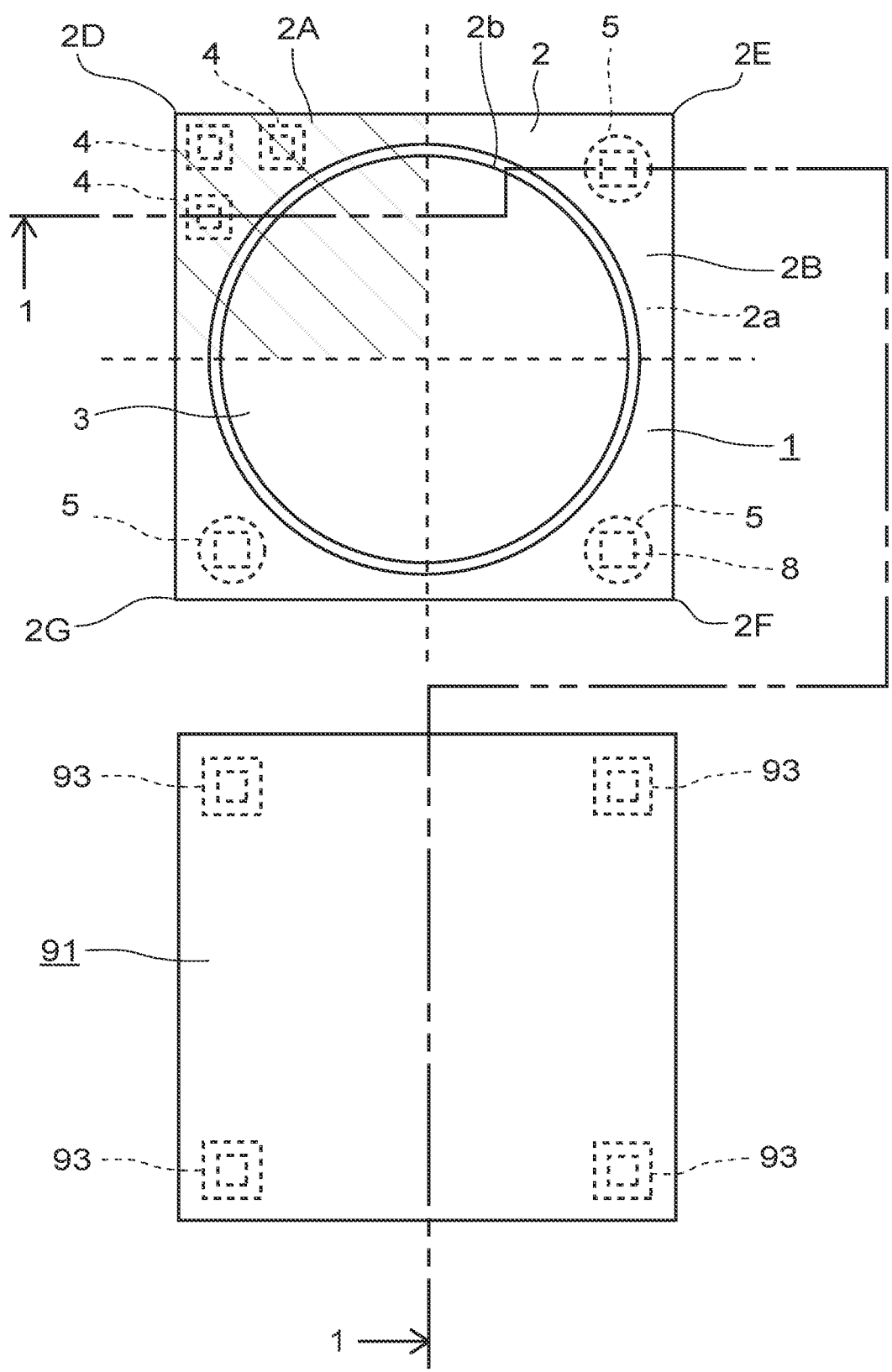
FIG. 4 is a plan view showing a principal part of the MEMS microphone which a cap is removed.

To begin with, structure of the MEMS package according to the embodiment of the present invention will be explained with reference to FIG. 1 to FIG. 4. Here, FIG. 1 is a sectional view of a part corresponding to the line 1-1 in FIG. 4 showing the MEMS microphone 100 having the MEMS package 1 according to the embodiment of the present invention, FIG. 2 is a sectional view showing the principal part of FIG. 1 with enlargement. FIG. 3 is a sectional view showing a part indicated by 3A in FIG. 2 with enlargement, FIG. 4 is a plan view showing the principal part of the MEMS microphone 100 which a cap 99 is removed.

As illustrated in FIG. 1, the MEMS microphone 100 has the MEMS package 1, ASIC (Application Specific Integrated Circuit) package 91 and the cap 99.

The MEMS package 1 has the MEMS chip 10, the package substrate 20, which the MEMS package 1 is adhered, three bonding bumps 4, three dummy bumps 5 and a sound shield 6.

The MEMS chip 10 has an element substrate 2 which the membrane 3, as a movable element, is formed. The MEMS chip 10 is used as the microphone of capacitance-type. The element substrate 2 is a substrate formed in a rectangular-shape in a plan view, as illustrated in FIG. 4, and it is formed with silicon. A hole part 2c is formed in the center of the element substrate 2. The hole part 2c is formed in a cylindrical-shape from an upper surface 2b (outside surface of the element substrate 2) of the element substrate 2 to an opposing surface 2a (the surface opposing to the package substrate 20), and the membrane 3 is formed in the opposing surface 2a side of the hole part 2c. Note that two thin-films, which are called back-plates (not illustrated), are arranged in the upper side and the lower side of the membrane 3.

Then, concerning the element substrate 2, as illustrated in FIG. 4, the opposing surface 2a has the bonding area 2A and the non-bonding area 2B. The bonding area 2A is an area which the all three bonding bumps 4 are arranged. The bonding area 2A is the part with hatching of the opposing surface 2a. The non-bonding area 2B is the area which no bonding bumps 4 are arranged. The non-bonding area 2B is the part with no hatching of the opposing surface 2a.

As illustrated in FIG. 1, the bonding bumps 4 are solder bumps adhered to both the opposing surface 2a and the package substrate 20. The MEMS package 1 has three bonding bumps 4 in total. The all three bonding bumps 4 are arranged, being gathered, in one part of the bonding area 2A. The bonding bumps 4 are not arranged in the area except for the bonding area 2A.

Then, the all three bonding bumps 4 are arranged in the outside the hole part 2c and in the neighborhood of a corner part 2D of four corner parts 2D, 2E, 2F, 2G, in the bonding area 2A. The all three bonding bumps 4 are gathered and arranged in the neighborhood of the corner part 2D. Namely, the all three bonding bumps 4 are unevenly arranged in one part of the opposing surface 2a (it is also called uneven arrangement that the bonding bumps are unevenly arranged in one part of the opposing surface 2a), the MEMS package 1 has an uneven arrangement structure by the three bonding bumps 4.

Figure 11A:
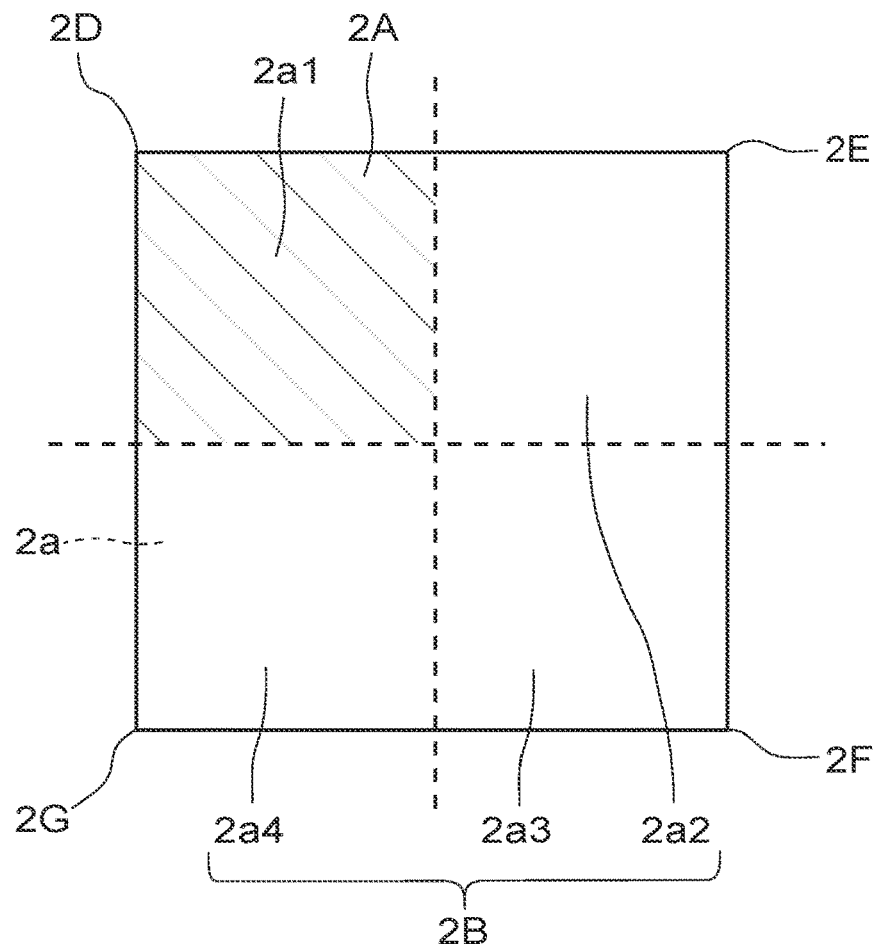
FIG. 11 (A) is a plan view, corresponding to FIG. 4, showing a bonding area and a non-bonding area of the case which an opposing surface is divided into four divided areas having equal size, FIG. 11 (B) is a plan view, corresponding to FIG. 4, showing the bonding area and the non-bonding area of the case which the opposing surface is divided into two divided areas having equal size.

Further, the bonding area 2A is assigned to a divided area 2a1 (part with hatching in FIG. 11(A)), as illustrated in FIG. 11(A). The divided area 2a1 is one area in the case when the opposing surface 2a is divided into four divided areas 2a1, 2a2, 2a3, 2a4 having equal size, the only corner part 2D, of the four corner parts 2D, 2E, 2F, 2G, is included in the divided area 2a1. The divided areas 2a2, 2a3, 2a4 are assigned to the non-bonding area 2B, and they are also called non-bonding divided areas. In case of the MEMS package 1, the size of the non-bonding area 2B is larger than the size of the bonding area 2A.

The non-bonding area 2B is a part except for the bonding area 2A of the opposing surface 2a, and three dummy bumps 5 are arranged in the non-bonding area 2B (see FIG. 4).

The membrane is vibration film formed approximately in a circular-shape, and it is a thin-film made of an inorganic metal such as $SiO_2$, SiN or the like.

The all three bonding bumps 4 are solder bumps made of solder. As illustrated in FIG. 1, the three bonding bumps 4 are adhered to both the MEMS chip 10 and the package substrate 20. Namely, the three bonding bumps 4 are adhered to electrode pads 7, formed in the opposing surface 2a, and electrode pads 21 formed in a package surface 20a (surface of the MEMS chip 10 side of the package substrate 20) of the package substrate 20. The three bonding bumps 4 connect the MEMS chip 10 electrically and fixedly to the package substrate 20.

The dummy bumps 5 are also solder bumps made of solder. As illustrated in FIG. 1, and illustrated in FIG. 2, FIG. 3 in detail, the dummy bumps 5 are adhered to the MEMS chip 10 by solder-junction, but solder-junction dose not exist between the dummy bumps 5 and the package substrate 20, the dummy bumps 5 are not adhered to the package substrate 20. The dummy bumps 5 are adhered to electrode pads 8 of the opposing surface 2a by solder-junction though, they are not adhered to insulated pads 9, merely being in contact with insulated pads 9 (there are no solder-junction). The insulated pads 9 have electrode pads 9b and insulated layers 9a made of solder resist and so on, the dummy bumps 5 are not adhered to the insulated layers 9a, merely being in contact with the insulated layers 9a (there are no solder-junction). In the part shown by 5A in FIG. 3, the dummy bumps 5 have structures being in contact with the insulated pads 9 without adhesion. In this embodiment, the above structure is also called a non-adhesion contact-structure, the dummy bumps 5 have respectively have the non-adhesion contact-structure. Each dummy bump 5 is electrically and fixedly connected to the MEMS chip 10 though, each dummy bump 5 is not electrically and fixedly connected to the package substrate 20. Each dummy bump 5 is arranged between the MEMS chip 10 and the package substrate 20, and it is merely a supporting member only supporting the MEMS chip 10. The sound shield 6 is made of silicone resin or the like, and it is formed between the MEMS chip 10 and the package substrate 20 so as to surround the MEMS chip 10.

The ASIC package 91 has an ASIC 92, the package substrate 20 which the ASIC 92 is adhered, and four bonding bumps 93. The ASIC 92, for example, is an integral circuit which amplifies an output signal of the MEMS chip 10 (an integral circuit which outputs displacement of a capacitance as displacement of the voltage in the MEMS chip 10). Electrode pads 14 are formed lower side of the ASIC 92. The electrode pads 14 are connected to the electrode pads 12 of the package surface 20a by the bonding bumps 93.

The package substrate 20 is a board like member made of ceramic or the like (or PCB: Printed Circuit Board). The electrode pads 21, insulated pads 9 and electrode pads 12 are formed on the package surface 20a of the package substrate 20. The MEMS package 1 is mounted on the part, of the package surface 20a, which the electrode pads 21 and the insulated pads 9 are formed, the ASIC package 91 is mounted on the part which the electrode pads 12 are formed. Further, a sound hole 20b is formed on the part, of the package substrate 20, which the MEMS package 1 is mounted. The sound hole 20b penetrates the package substrate 20 from the package surface 20a to a bottom surface 20c on the opposite side.

The cap 99 covers the MEMS package 1 and the ASIC package 91, and it is adhered to the package surface 20a with not illustrated adhesive (or by soldering). A space 99A is secured by the cap 99 and the package substrate 20, the MEMS package 1 and the ASIC package 91 are accommodated in the space 99A.

(Method of Manufacturing the MEMS Package)

Figure 5:
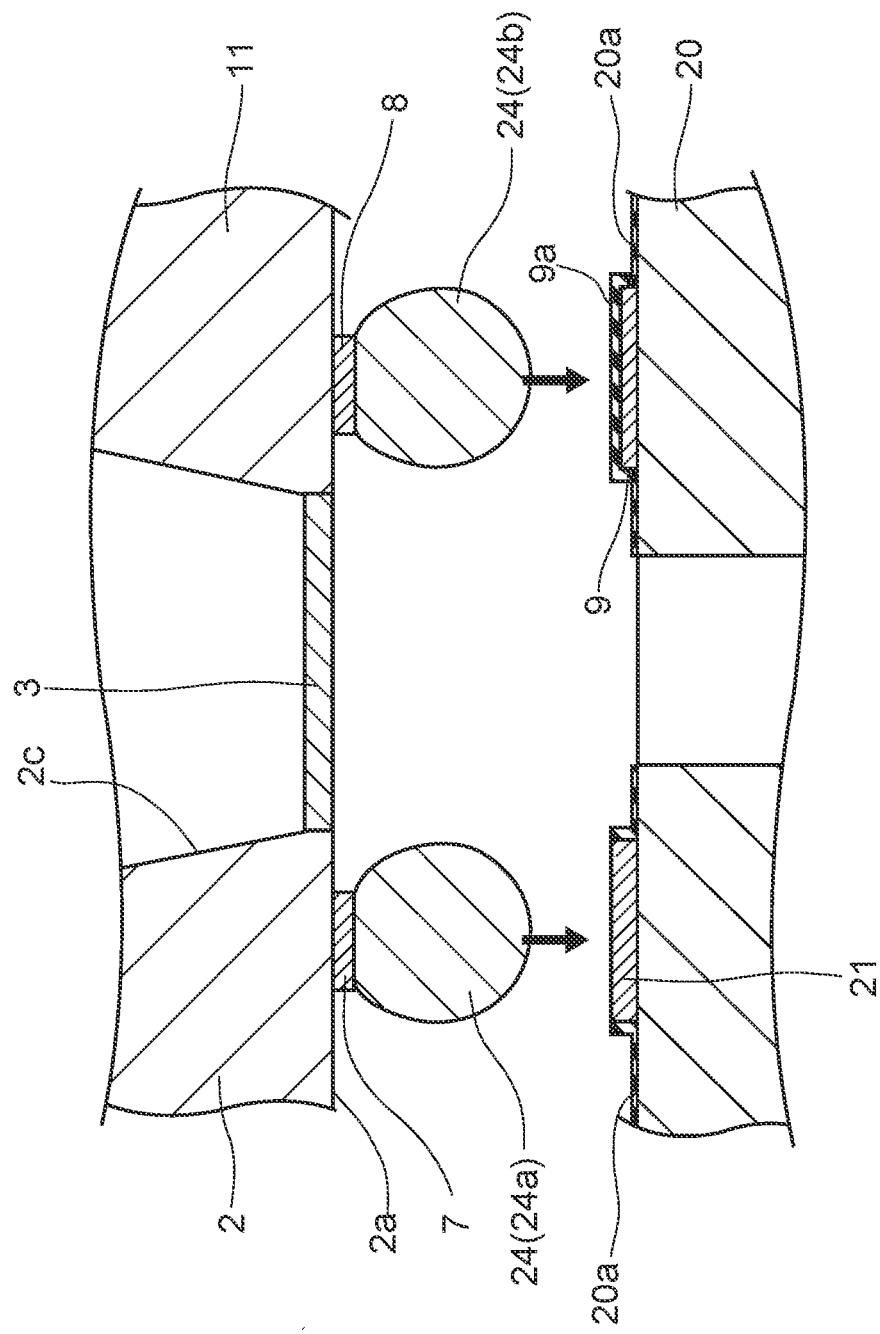
FIG. 5 is a sectional view showing a principal part of manufacturing step of the MEMS package in the manufacturing step of the MEMS microphone.
Figure 6:
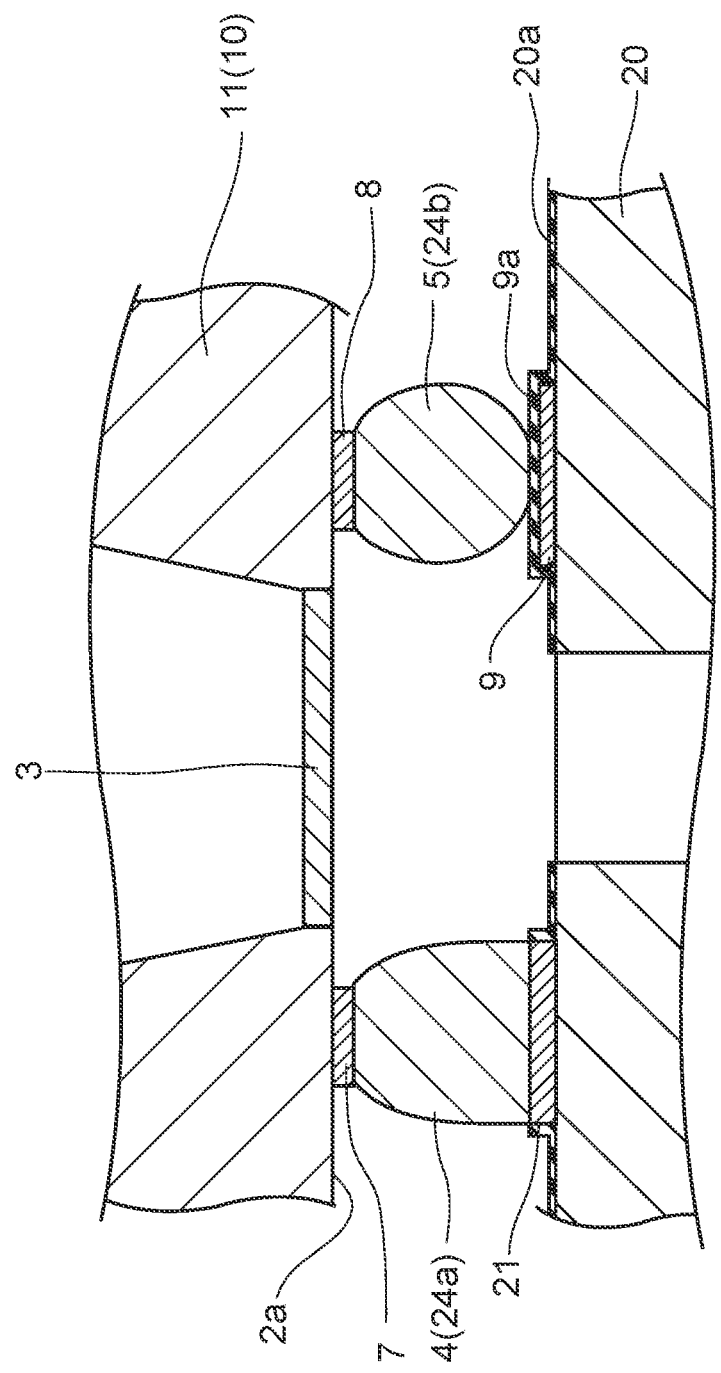
FIG. 6 is a sectional view showing a principal part of the manufacturing step subsequent to that in FIG. 5.

Subsequently, the method of manufacturing the MEMS package 1, having the above structure, will be explained with reference to FIG. 5, FIG. 6. FIG. 5 is a sectional view showing a principal part of a manufacturing step of the MEMS package 1 in the manufacturing step of the MEMS microphone 100. FIG. 6 is a sectional view showing a principal part of the manufacturing step subsequent to that in FIG. 5.

In the Method of manufacturing the MEMS package 1, the MEMS package 1 is manufactured with the above-mentioned MEMS chip 10 and the package substrate 20 which the MEMS chip 10 is adhered. In case of the method of manufacturing according to the embodiment, the MEMS chip 10 (rectangular MEMS chip), having the rectangular element substrate 2, is used. An electrode pad forming step, a bump forming step, a MEMS chip mounting step and a MEMS chip connecting step are included in the Method of manufacturing the MEMS package 1.

In the electrode pad forming step, the electrode pads 7, 8 are formed on the element substrate 2. The three electrode pads 7, 8 are respectively formed on the opposing surface 2a of the package substrate 2. In this case, the three electrode pads 7 are formed in the neighborhood of the corner part 2D of the above-described divided 2a1, one electrode pad 8 is formed respectively in the neighborhood of the corner parts 2E, 2F, 2G of the divided areas 2a2, 2a3, 2a4. The three electrode pads 7 are formed with uneven arrangement similar with the bonding bumps 4. Further, in the package substrate 20, the electrode pads 21 are formed on the part, of the package surface 20a, corresponding to the electrode pads 7, the insulated pads 9 are formed on the part, of the package surface 20a, corresponding to the electrode pads 8. The electrode pads 8 and the insulated pads 9 are able to be formed previously to the electrode pads 7, 8 and they are able to be formed after than the electrode pads 7, 8. In this case, the electrode pads 21, 9b are formed, after that, a solder-resist 9a is applied thinly on the package surface 20a. The parts of the solder-resist 9a on the electrode pads 21 are opened, thereby the electrode pads 21 are exposed. However, the parts of the solder-resist 9a on the electrode pads 9b are left. The left solder-resists 9a become the above-described insulated layer 9a. Namely, in the package surface 20a, concerning the electrode pads corresponding to the dummy bumps 5 (the electrode pads 9b, in the embodiment), the insulated layer (solder-resist) 9a is kept remaining on the surface.

Next, the bump forming step is performed. In the bump forming step, at first, one solder ball is respectively mounted on the six electrode pads 7, 8 in total, formed in the above-described electrode pad forming step. Because the six electrode pads 7, 8 in total are formed as mentioned above, the six solder balls are arranged on the opposing surface 2a, in the bump forming step. After that, the element substrate 2, which the solder balls are mounted, is put into the heating reflow furnace. Then, the solder balls melt and the solder bumps 24 are formed, as illustrated in FIG. 5. The solder bumps 24a, among the solder bumps 24, are mounted on the electrode pads 7, the solder bumps 24b are mounted on the electrode pads 8. Note that the solder bumps 24a are unevenly arrangement bumps which become the bonding bumps 4 later, the solder bumps 24b become the dummy bumps 5 afterward. The solder bumps 24a are arranged in the neighborhood of the above-mentioned corner part 2D, in the above-mentioned divided area 2a1.

Subsequently, the MEMS chip mounting step is performed. In the MEMS chip mounting step, a MEMS chip with bumps 11 is mounted on the package substrate 20. In this case, as illustrated in FIG. 6, the MEMS chip mounting step is performed so that the solder bumps 24a are arranged on the electrode pads 21 of the package surface 20a, and the solder bumps 24b are arranged on the insulated pads 9.

Next, the MEMS chip connecting step is performed. In this case, the package substrate 20, which the MEMS chip with bumps 11 is mounted, is put into the not-illustrated heating reflow furnace. In this case, as illustrated in FIG. 6, the solder bumps 24a are in contact with both the electrode pads 7 and the electrode pads 21. Therefore, the solder bumps 24a are adhered to both the electrode pads 7 and the electrode pads 21 after melting, and they become the bonding bumps 4. However, concerning the solder bumps 24b, because the surface of the insulated pads 9 are the insulated layers 9a, the solder bumps 24b are not adhered to the insulated pads 9 merely being contact with them, even if they melted. Therefore, the solder bumps 24b become the dummy bumps 5. After that the sound shield 6 is formed (the sound shield 6 is sometimes formed before the MEMS chip with bumps 11 is mounted). The MEMS package 1 is manufactured by performing the above-mentioned steps.

After that, the ASIC package 91 is mounted on the package substrate 20, further when the cap 99 is covered, the MEMS microphone 100 is manufactured. Note that a package reflow is able to be performed about both the MEMS chip 10 and ASIC package 91, when the ASIC package 91 is mounted on the package substrate 20.

(Operation and Effect of the MEMS Package)

As mentioned above, the MEMS package 1 has three bonding bumps 4 in total, the three bonding bumps 4 are unevenly arranged in one part of the opposing surface 2a (in the neighborhood of the corner part 2D of the bonding area 2A). The bonding bumps 4 are not arranged in a part except for the bonding area 2A. The bonding bumps 4 are formed, thereby the MEMS chip 10 are fixedly and electrically connected to the package substrate 20.

Then, because there is a difference in materials of the MEMS chip 10 and the package substrate 20, thermal expansion coefficients of them are different. Therefore, change of volume differs between the MEMS chip 10 and the package substrate 20 after temperature of them decreases. Therefore, strain is likely applied to the MEMS chip 10 mounted on the package substrate 20.

Figure 12:
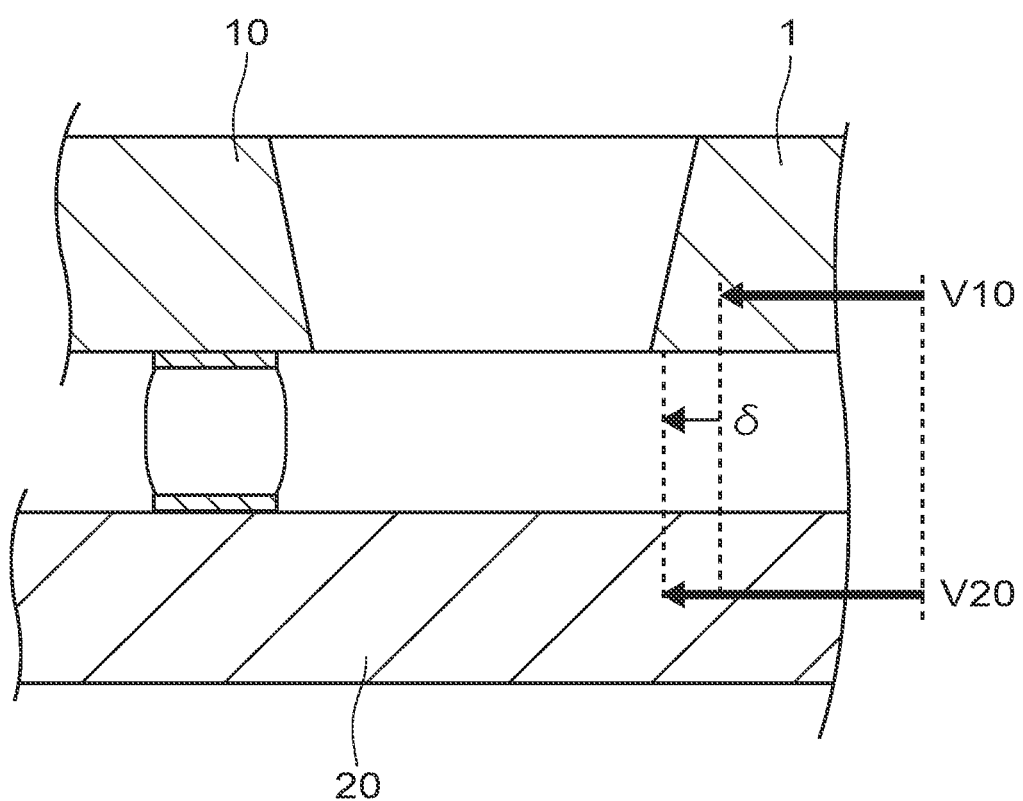
FIG. 12 is a sectional view schematically showing stress applied to the MEMS package.

However, because the bonding bumps 4 are not arranged in a part except for the bonding area 2A, the non-bonding area 2B is a free end to the package substrate 20. Therefore, the MEMS package 1 is connected to the package substrate 20 as if it is cantilever. Then for example, as illustrated in FIG. 12, when a strain $\delta$ occurs in the MEMS package 1, caused by the difference of volume change v10 of the MEMS chip 10 and volume change v20 of the package substrate 20, the part except for the bonding area 2A (non-bonding area 2B) slides. Thereby the strain $\delta$ is absorbed. Accordingly, stress applied to the membrane 3 is able to decrease, in the MEMS package 1.

Accordingly, concerning the MEMS package 1, relaxing of stress, caused by the difference of thermal expansion coefficient of the materials, is able to be obtained. Therefore, the vibration or amplitude of the membrane 3 of the MEMS microphone 100, which sound pressure is applied, is suitable. Further, because an enlargement of the thickness of the membrane 3, for standing up to the stress, is not also necessary, good sensitivity is able to be secured.

Further, in the MEMS package 1, the size of the non-bonding area 2B is larger than the size of the bonding area 2A. Therefore, the part which is free end to the package substrate 20 is larger than the part which is fix end. Then, because the part, which exhibits the function releasing the strain 6, becomes larger than the part applied the strain 6, more effective relaxing of stress is able to be obtained.

On the other hand, in the MEMS package 1, the three dummy bumps 5 are arranged in the non-bonding area 2B. The dummy bumps 5 are not adhered to the opposing surface 2a. Therefore, even if the dummy bumps 5 are arranged, the non-bonding area 2B remain free end, relaxing of stress is able to be obtained. Moreover, the distance, between the MEMS package 1 and the package substrate 20, becomes regular size in the non-bonding area 2B and bonding area 2A, by the formation of the dummy bumps 5. Therefore, because the MEMS chip 10 is held in parallel to the package substrate 20, the MEMS package 1 becomes hard to be broken, it brings preferable effects.

Then, the MEMS package 1 has a special feature which a plurality of bonding bumps 4 are formed with unevenly arrangement, relaxing of the stress applied to the membrane 3 is able to be obtained by the special feature. The above-mentioned special feature is realized by design of arrangement of the bonding bumps 4. Further, it also has a special feature which the dummy bumps 5 are formed, more effective effect is able to be obtained by the special feature. However, the dummy bumps 5 are formed by the arrangement of solder bumps on the insulated pads 9. Therefore, in case of the manufacturing the MEMS package 1, new devices are not necessary.

Modified Example 1

Figure 7A:
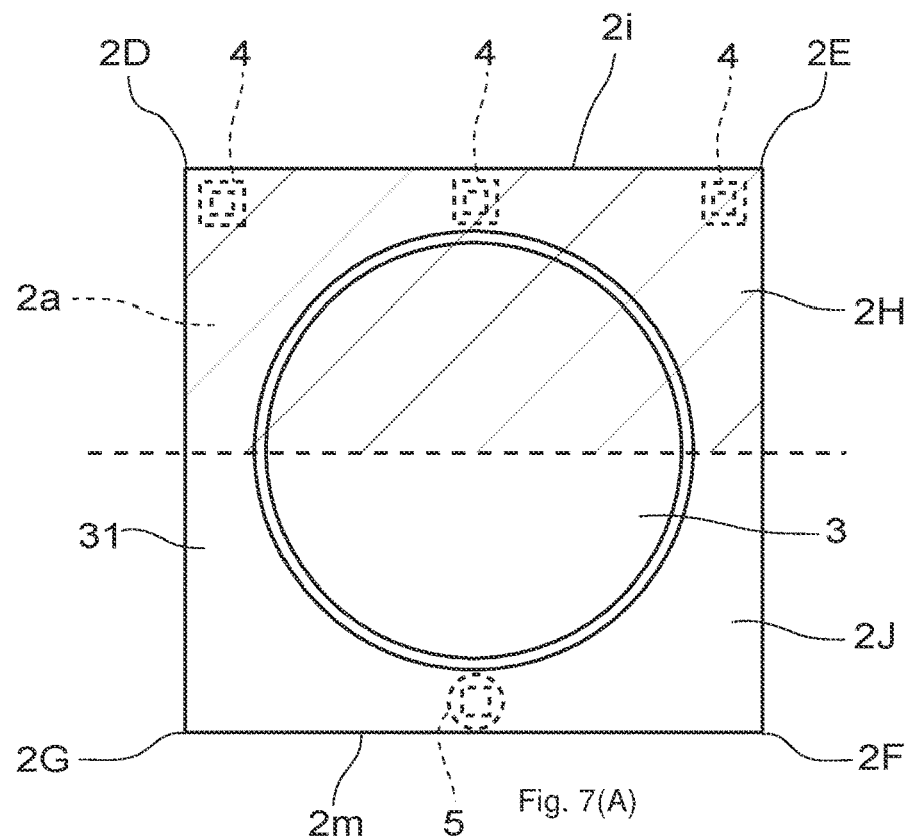
FIG. 7 (A) is a plan view, corresponding to FIG. 4, showing the MEMS package according to a modified example, FIG. 7 (B) is a plan view, corresponding to FIG. 4, showing the other MEMS package according to the modified example.
Figure 7B:
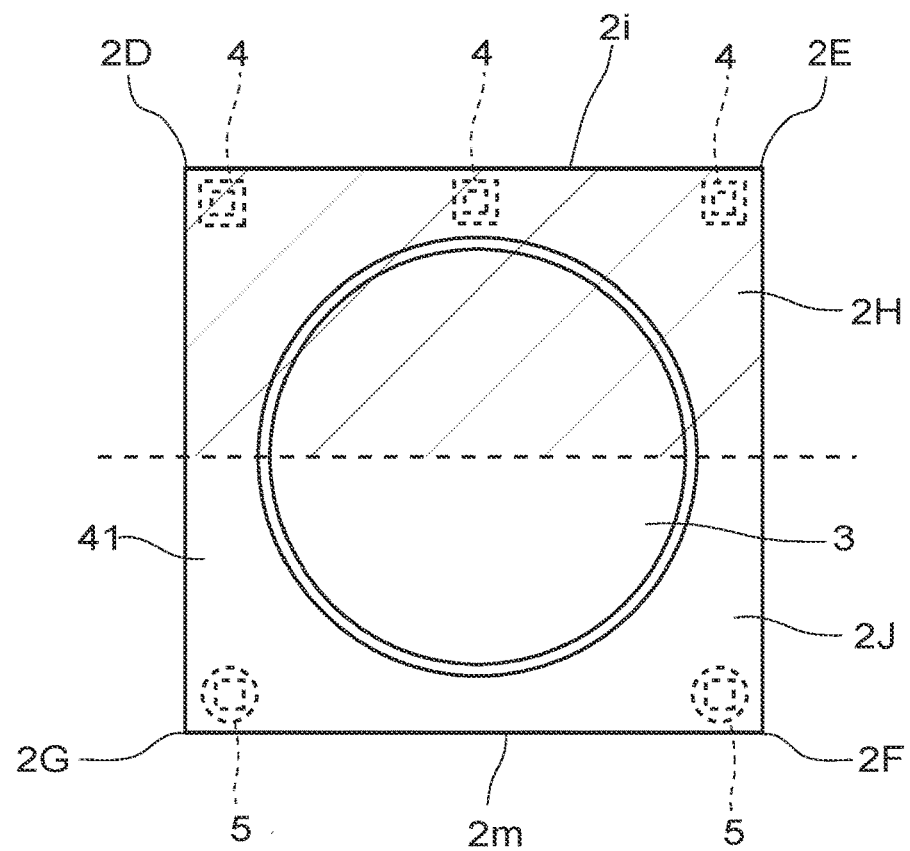

Next, the MEMS packages 31, 41, according to a modified example 1 are explained with reference to FIGS. 7 (A), (B). Here, FIG. 7 (A) is a plan view, corresponding to FIG. 4, showing the MEMS package 31 according to the modified example 1, FIG. 7 (B) is a plan view, corresponding to FIG. 4, showing the other MEMS package 41 according to the modified example 1.

The MEMS package 31 is different in that it has a bonding area 2H, non-bonding area 2J, and it is different in the arrangement of the bonding bumps 4, and number of the arranged dummy bumps 5 and arrangement of the dummy bumps 5, as compared with the MEMS package 1.

In case of the MEMS package 1, the bonding area 2A is assigned to the divided area 2a1 of the divided areas 2a1, 2a2, 2a3, 2a4, the non-bonding area 2B is assigned to the divided areas 2a2, 2a3, 2a4.

Figure 11B:
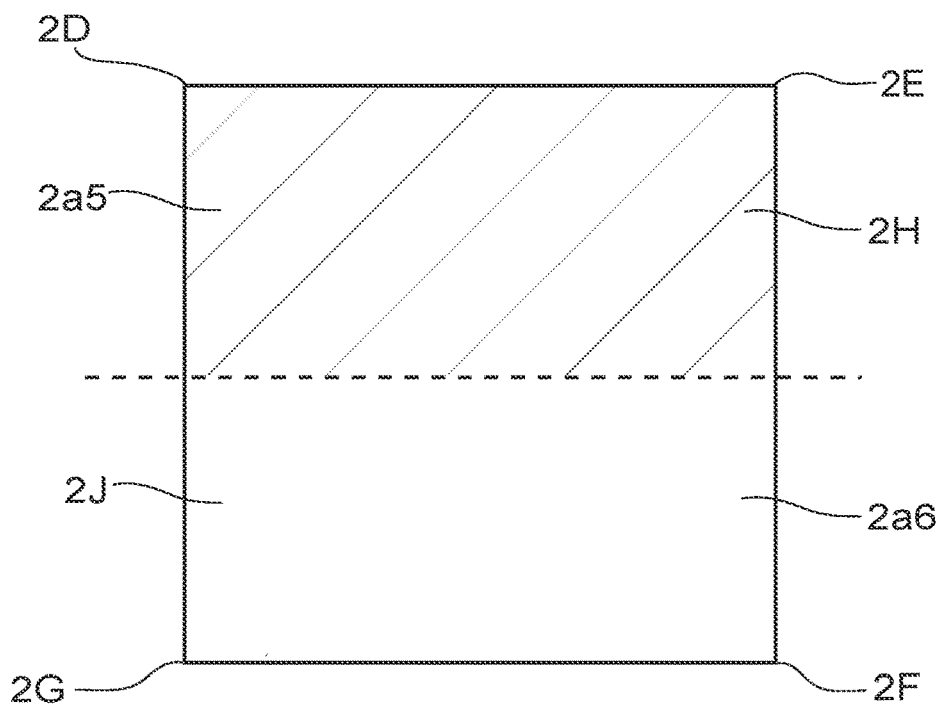

On the other, in case of the MEMS package 31, as illustrated in FIG. 11(B), the bonding area 2H is assigned to a divided area 2a5, the non-bonding area 2J is assigned to a divided area 2a6. The divided areas 2a5, 2a6 are respectively one area of the case when the opposing surface 2a is divided into two rectangular areas having equal size. The corner parts 2D, 2E are included in the divided area 2a5.

Then the bonding bumps 4 are arranged along with an outer end part 2i of the opposing surface 2a so as to stand in a line. The outer end part 2i is a one-side part corresponding to a one side of four sides of the opposing surface 2a, and it is a part corresponding to the one side connecting the corner part 2D to the corner part 2E.

The one dummy bump 5 is arranged in a middle part of an outer end part 2m of the non-bonding area 2J.

In the MEMS package 31, because the bonding bumps 4 are arranged in only the bonding area 2H, the MEMS chip 10 is connected to the package substrate 20 as if it is cantilever. Therefore, when the strain δ occurs in the MEMS package 31, caused by the difference of volume change v10 of the MEMS chip 10 and volume change v20 of the package substrate 20, the non-bonding area 2J slides, thereby the strain δ is absorbed. Accordingly, the stress applied to the membrane 3 is able to decrease, in the MEMS package 31. Further, because the dummy bump 5 is arranged in the non-bonding area 2J, the MEMS chip 10 is held in parallel to the package substrate 20.

Further, the MEMS package 41 is different in the number and arrangement of the arranged dummy bumps 5, as compared with the MEMS package 31. In case of the MEMS package 31, the one dummy bump 5 is arranged in the middle part of the outer end part 2m though, in case of the MEMS package 41, the dummy bumps 5 are arranged respectively in both sides of the outer end part 2m. The stress applied to the membrane 3 is also able to decrease, in the MEMS package 41. Furthermore, because the dummy bumps 5 are arranged respectively in both sides of the outer end part 2m, the MEMS chip 10 is held more stably.

Modified Example 2

Figure 8A:
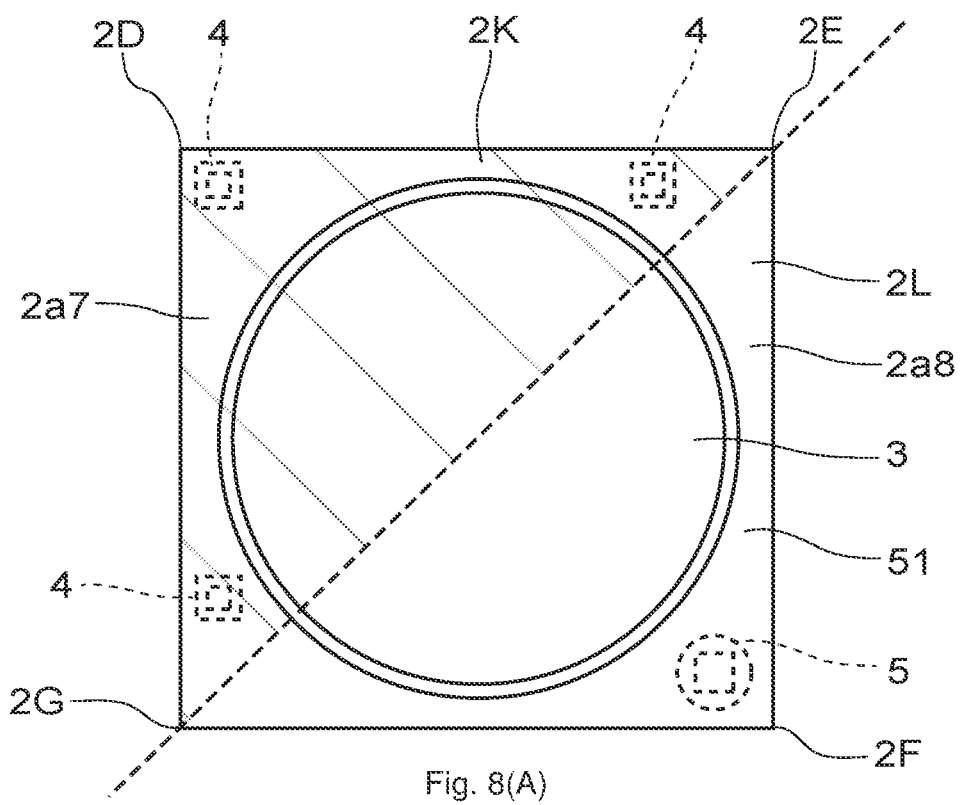
FIG. 8 (A) is a plan view, corresponding to FIG. 4, showing the MEMS package according to the modified example, FIG. 8 (B) is a plan view, corresponding to FIG. 4, showing the other MEMS package according to the modified example.
Figure 8B:
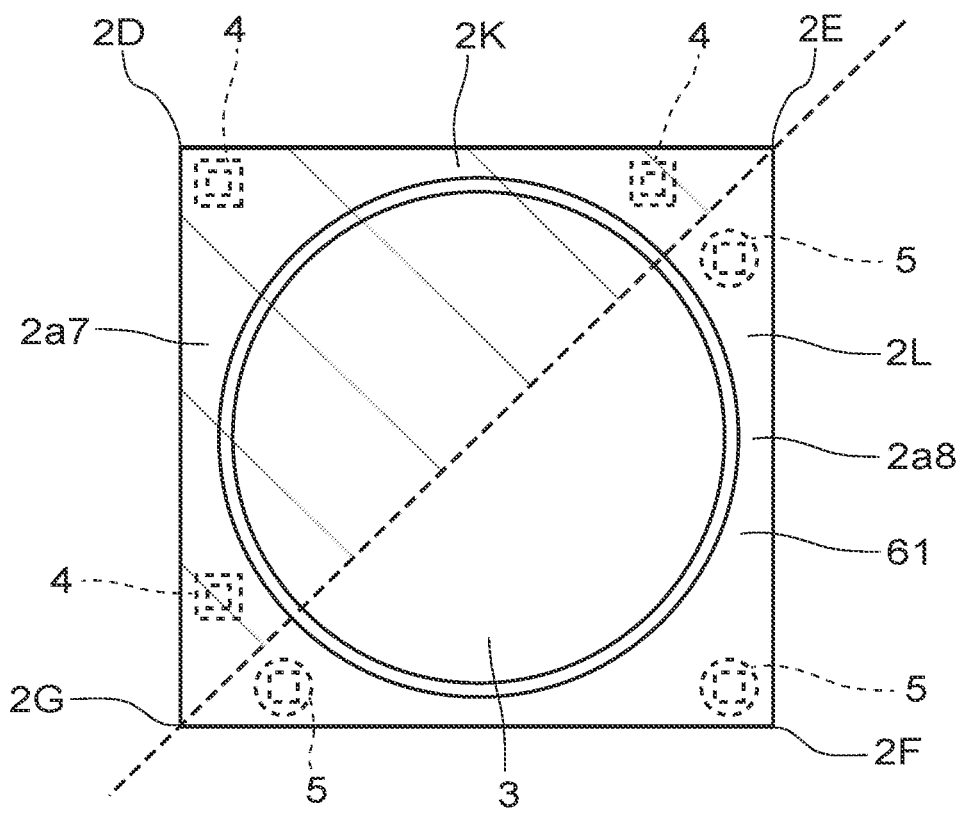

Next, the MEMS packages 51, 61, according to the modified example 2 are explained with reference to FIGS. 8 (A), (B). Here, FIG. 8 (A) is a plan view, corresponding to FIG. 4, showing the MEMS package 51 according to the modified example 2, FIG. 8 (B) is a plan view, corresponding to FIG. 4, showing the other MEMS package 61 according to the modified example 2.

The MEMS package 51 is different in that it has a bonding area 2K, non-bonding area 2L, and it is different in the arrangement of the bonding bumps 4, and the arrangement of the dummy bumps 5, as compared with the MEMS package 31.

In case of the MEMS package 51, the bonding area 2K is assigned to the divided area 2a7, the non-bonding area 2L is assigned to the divided area 2a8. The divided areas 2a7, 2a8 are respectively one area of the case when the opposing surface 2a are divided into two triangular areas having equal size.

Then the one bonding bump 4 is respectively arranged in the neighborhood of the three corner parts 2D, 2E, 2G.

The one dummy bump 5 is arranged in the neighborhood of the corner part 2F of the non-bonding area 2L.

In the MEMS package 51, because the bonding bumps 4 are arranged in only the bonding area 2K, the MEMS chip 10 is connected to the package substrate 20 as if it is cantilever. Therefore, when the strain δ occurs in the MEMS package 51, caused by the difference of volume change v10 of the MEMS chip 10 and volume change v20 of the package substrate 20, the non-bonding area 2L slides, thereby the strain δ is absorbed. Accordingly, the stress applied to the membrane 3 is able to decrease, in the MEMS package 51. Further, because the dummy bump 5 is arranged in the non-bonding area 2L, the MEMS chip 10 is held in parallel to the package substrate 20.

Further, the MEMS package 61 is different in the number and arrangement of the arranged dummy bumps 5, as compared with the MEMS package 51. In case of the MEMS package 51, the one dummy bump 5 is arranged in the neighborhood of the corner part 2F though, in case of the MEMS package 61, the one dummy bump 5 is arranged respectively in the neighborhood of the corner parts 2G, 2E, 2F. The stress applied to the membrane 3 is also able to decrease, in the MEMS package 61. Furthermore, because the dummy bump 5 is arranged respectively in the neighborhood of the corner parts 2G, 2E, 2F, the MEMS chip 10 is held more stably.

Modified Example 3

Figure 9A:
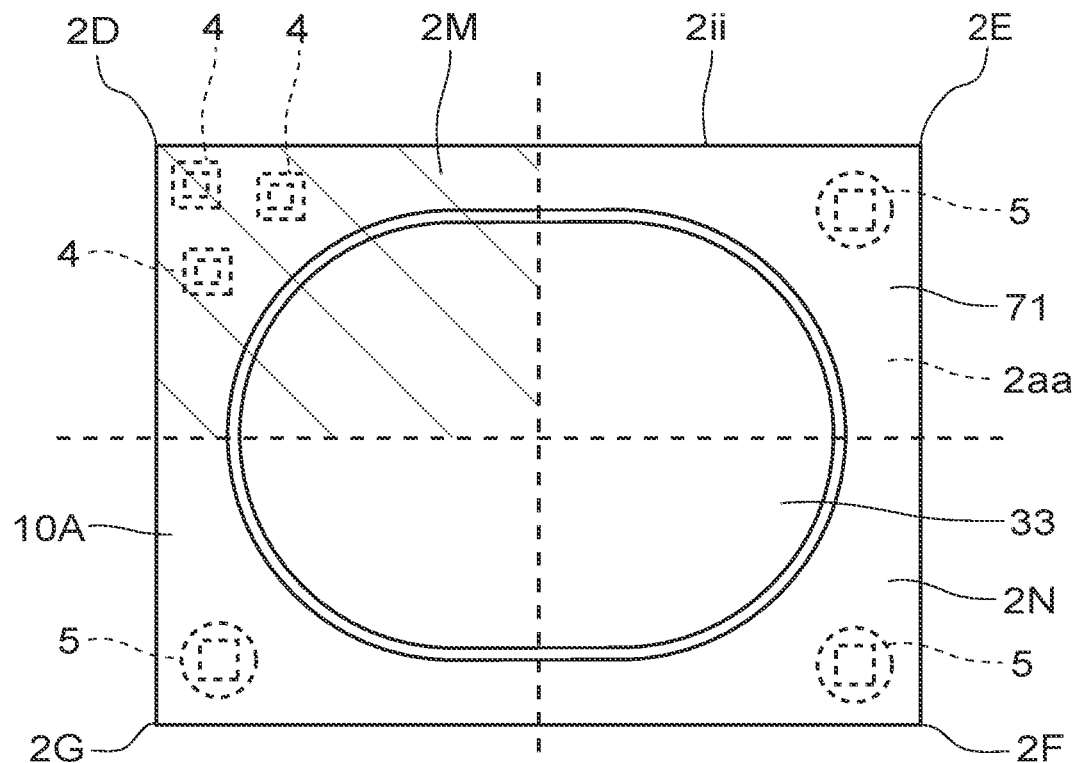
FIG. 9 (A) is a plan view, corresponding to FIG. 4, showing the MEMS package according to the modified example, FIG. 9 (B) is a plan view, corresponding to FIG. 4, showing the other MEMS package according to the modified example.
Figure 9B:
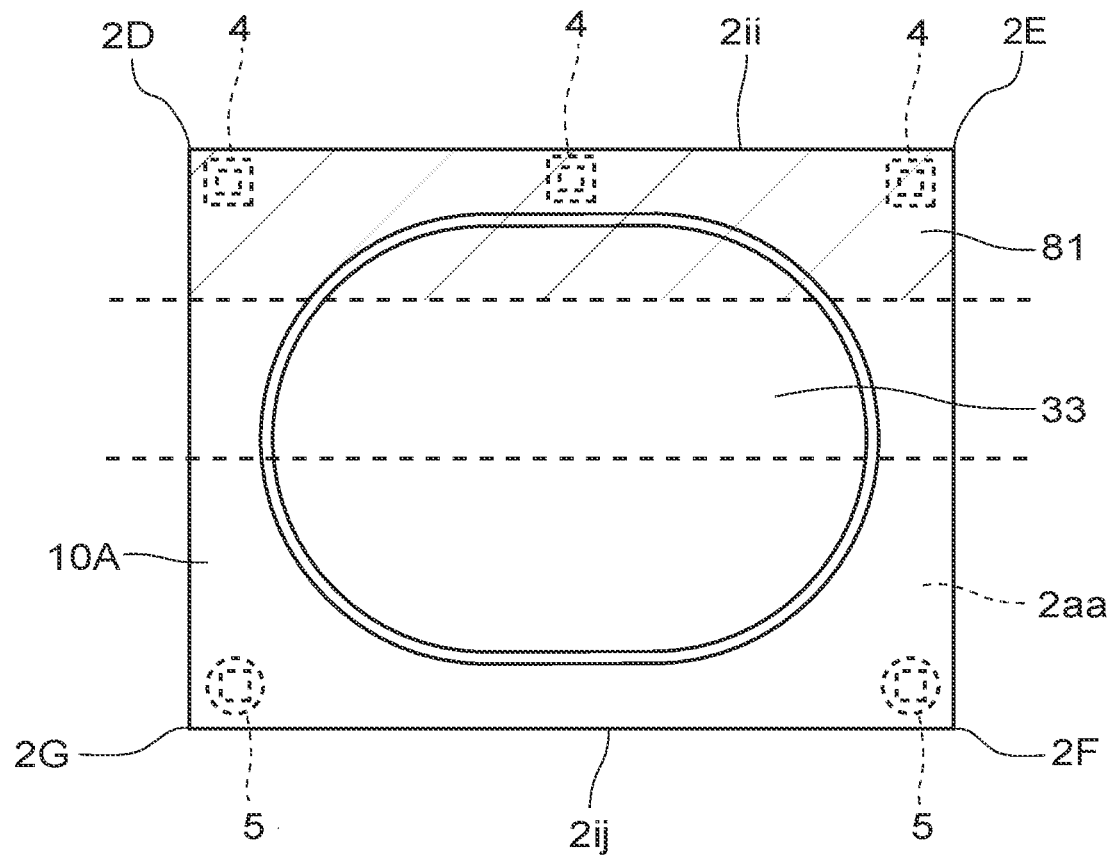

Next, the MEMS packages 71, 81, according to the modified example 3 are explained with reference to FIGS. 9 (A), (B). Here, FIG. 9 (A) is a plan view, corresponding to FIG. 4, showing the MEMS package 71 according to the modified example 3, FIG. 9 (B) is a plan view, corresponding to FIG. 4, showing the other MEMS package 81 according to the modified example 3.

The MEMS package 71 is different in that it has a membrane 33 having a form which is different from the membrane 3, and it is different in the form of the opposing surface 2a.

In case of the MEMS package 1, the membrane 3 is formed in the circular-shape though, in case of the MEMS package 71, the membrane 33 is formed in an elliptic shape. In accordance with the above, the form of the opposing surface 2aa of the MEMS package 71 is also different from the opposing surface 2a of the MEMS package 1.

In the MEMS package 71, because the bonding bumps 4 are arranged in only the bonding area 2M, similar with the MEMS package 1, the MEMS chip 10A is connected to the package substrate 20 as if it is cantilever. Therefore, when the strain δ occurs in the MEMS package 71, caused by the difference of volume change v10 of the MEMS chip 10A and volume change v20 of the package substrate 20, the non-bonding area 2N slides, thereby the strain δ is absorbed. Accordingly, the stress applied to the membrane 33 is able to decrease, in the MEMS package 71. Further, because the dummy bump 5 is arranged in the non-bonding area 2N, the MEMS chip 10A is held in parallel to the package substrate 20.

Further, the MEMS package 81 is different in the arrangement of the bonding bumps 4, the number and arrangement of the arranged dummy bumps 5, as compared with the MEMS package 71.

In case of the MEMS package 71, the bonding bump 4 is arranged in the neighborhood of the corner part 2D though, in case of the MEMS package 81, the bonding bumps 4 are arranged along with an outer end part 2ii so as to stand in a line. The outer end part 2ii is the one-side part corresponding to the one side of four sides of the opposing surface 2aa, and it is the part corresponding to the one side connecting the corner part 2D to the corner part 2E. The band like part (part with hatching), along with the outer end part 2ii, corresponds to the bonding area of the MEMS package 81.

The dummy bumps 5 are arranged in both sides of the outer end part 2ij along with it. The outer end part 2ij is the one-side part connecting the corner part 2F to the corner part 2G. The part, including the outer end part 2ij, except for the bonding area, corresponds to the non-bonding area.

In case of the MEMS package 81, because the bonding bumps 4 are arranged in only the bonding area, similar with the MEMS package 1, the MEMS chip 10A is connected to the package substrate 20 as if it is cantilever. Therefore, when the strain δ occurs in the MEMS package 81, caused by the difference of volume change the v10 of the MEMS chip 10A and volume change v20 of the package substrate 20, the non-bonding area slides, thereby the strain δ is absorbed. Accordingly, the stress applied to the membrane 33 is able to decrease, in the MEMS package 81. Further, because the dummy bump 5 is arranged in the non-bonding area, the MEMS chip 10A is held in parallel to the package substrate 20.

Modified Example 4

Figure 10:
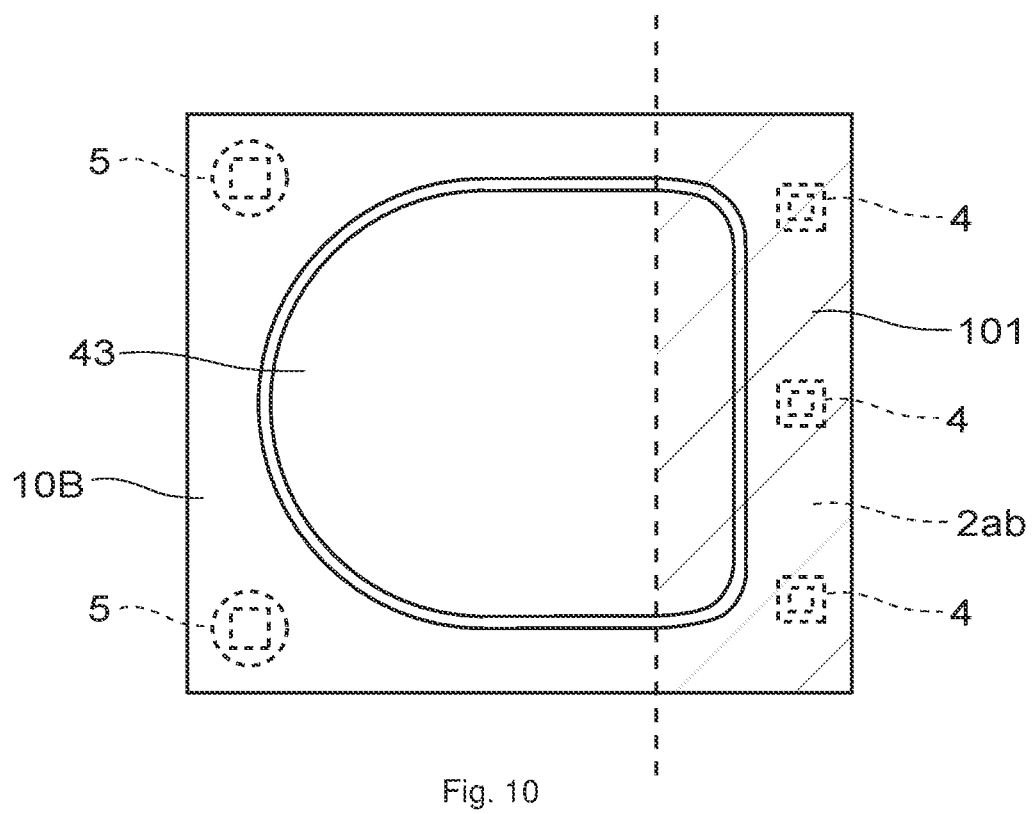
FIG. 10 is a plan view, corresponding to FIG. 4, showing the MEMS package according to the modified example.

Next, the MEMS package 101, according to the modified example 4, is explained with reference to FIG. 10. Here, FIG. 10 is a plan view, corresponding to FIG. 4, showing the MEMS package 101 according to the modified example 4.

The MEMS package 101 is different in that it has a membrane 43 having a form which is different from the membrane 33, and it is different in the form of the opposing surface 2a.

In case of the MEMS package 81, the membrane 33 is formed in the elliptic shape though, in case of the MEMS package 101, the membrane 43 is formed in a modified elliptic shape. One side curved-line part of the membrane 43 is formed in approximately straight line. In accordance with the above, the form of the opposing surface 2ab of the MEMS package 101 is also different from the opposing surface 2aa of the MEMS package 81.

The MEMS packages according to the embodiment of the present invention are able to have not only the circular membrane 3 but also non-circular membranes such as the membrane 33, the membrane 43 or the like.

In the MEMS package 101, because the bonding bumps 4 are arranged in only the bonding area (part with hatching in FIG. 10), similar with the MEMS package 81, the MEMS chip 10B is connected to the package substrate 20 as if it is cantilever. Therefore, when the strain δ occurs in the MEMS package 101, caused by the difference of volume change v10 of the MEMS chip 10B and volume change v20 of the package substrate 20, the non-bonding area slides, thereby the strain δ is absorbed. Accordingly, the stress applied to the membrane 43 is able to decrease, in the MEMS package 101. Further, because the dummy bump 5 is arranged in the non-bonding area, the MEMS chip 10B is held in parallel to the package substrate 20.

In the above-described embodiments, the MEMS package 1, having the membrane 3, is exemplarily explained though, the present invention is able to be applied to another MEMS packages. For example, the present invention is also applicable to the MEMS packages having the MEMS chip being used as a sensor, an actuator and so on. Further, the type "double back-plate" having two not illustrated thin-films which are called back-plate are arranged in the upper side and the lower side of the membrane 3, is explained exemplarily in the embodiment. The present invention is also applicable to the type "single back-plate", having one back-plate is arranged in the one side of the membrane 3. In this case, it is sufficient that the two bonding bumps 4 are formed.

This invention is not limited to the foregoing embodiments but various changes and modifications of its components may be made without departing from the scope of the present invention. Besides, it is clear that various embodiments and modified examples of the present invention can be carried out on the basis of the foregoing explanation. Therefore, the present invention can be carried out in modes other than the above-mentioned best modes within the scope equivalent to the following claims.

What is claimed is:

1. A MEMS package comprising:
   a MEMS chip, and a package substrate which the MEMS chip is adhered;
   wherein the MEMS chip comprises an element substrate which a movable element is formed,
   wherein the MEMS package comprises a plurality of bonding bumps adhered to both an opposing surface, of the element substrate, which opposes the package substrate and the package substrate,
   wherein the MEMS package comprises an unevenly arranged structure which all the plurality of bonding bumps are unevenly arranged in a part of the opposing surface,
   wherein the package substrate comprises a plurality of electrode pads formed in a package surface, opposing to the MEMS chip, and an insulated layer,
   wherein at least one of the electrode pads is formed as an insulated pad, which the surface is covered with the insulated layer,
   wherein the MEMS package further comprises a dummy bump which is in contact with the insulated layer, arranged on the insulated pad, without being adhered to the insulated layer.

2. The MEMS package according to claim 1,
wherein the opposing surface comprises a bonding area, in which all the plurality of bonding bumps are arranged, and a non-bonding area, in which the bonding bumps are not arranged, the size of the non-bonding area is larger than the size of the bonding area.

3. The MEMS package according to claim 1,
wherein the opposing surface comprises a bonding area, in which all the plurality of bonding bumps are arranged, and a non-bonding area, in which the bonding bumps are not arranged, the size of the non-bonding area is larger than the size of the bonding area,
wherein the dummy bump is arranged in the non-bonding area.

4. The MEMS package according to claim 2,
wherein the element substrate is formed in a rectangular-shape in a plan view,
wherein the bonding area is assigned to an area including only one of the four corner parts of the opposing surface.

5. The MEMS package according to claim 1,
wherein the element substrate is formed in a rectangular-shape in a plan view,
wherein all the plurality of bonding bumps are arranged along with one side of the opposing surface.

6. The MEMS package according to claim 1,
wherein the opposing surface comprises a bonding area, which all the plurality of bonding bumps are arranged, and a non-bonding area, which the bonding bumps are not arranged, the bonding area is assigned to a divided area of the case when the opposing surface is divided into two divided areas having equal size.

7. The MEMS package according to claim 1,
wherein the opposing surface comprises a bonding area, which all the plurality of bonding bumps are arranged, and a non-bonding area, which the bonding bumps are not arranged, the bonding area is assigned to a divided area of the case when the opposing surface is divided into four divided areas having equal size.

8. The MEMS package according to claim 7,
wherein the dummy bump is arranged in a non-bonding divided area which is not assigned to the bonding area of the four divided areas.

9. A method of manufacturing a MEMS package, using a MEMS chip and a package substrate which the MEMS chip is adhered comprising:
a bump forming step of forming a plurality of solder bumps on an opposing surface, of the MEMS chip, opposing to the package substrate;
a step for forming a plurality of electrode pads in a package surface, of the package substrate, opposing to the MEMS chip, and applying solder resist on the package surface of the package substrate to form an insulated pad, which the surface is covered with the solder resist, with at least one of the plurality of electrode pads, and opening the surfaces of the electrode pads except for the insulated pad, and
a MEMS chip mounting step of mounting a MEMS chip with bump, which the plurality of solder bumps are formed by the bump forming step, on the package substrate;
wherein the bump forming step is performed so that at least two solder bumps of the plurality of solder bumps become unevenly arranged bumps which are unevenly arranged in a part of the opposing surface,
wherein the MEMS chip mounting step is performed so that the unevenly arranged bumps are arranged in the electrode pads, of the package substrate, which the surfaces are opened, and at least one solder bump except for the unevenly arranged bumps is arranged in the insulated pad.

10. The method of manufacturing a MEMS package according to claim 9, further comprising:
a MEMS chip connecting step of making the solder bump arranged in the insulated pad a dummy bump which is adhered to the opposing surface and is not adhered to the package substrate.

11. The method of manufacturing a MEMS package according to claim 9,
wherein the bump forming step is performed so that the unevenly arranged bumps are arranged in one of four divided areas, having the equal size, which the opposing surface is divided.

12. The method of manufacturing a MEMS package according to claim 9,
a rectangular MEMS chip, having an element substrate formed in a rectangular-shape in a plan view, is used as the MEMS chip,
wherein the bump forming step is performed so that the unevenly arranged bumps are respectively arranged in the neighborhood of one of four corner parts of the element substrate.

13. The method of manufacturing a MEMS package according to claim 9,
a rectangular MEMS chip, having an element substrate formed in a rectangular-shape in a plan view, is used as the MEMS chip,
wherein the bump forming step is performed so that the unevenly arranged bumps are arranged along with one side of the element substrate.

* * * * *